(12) United States Patent
Smith et al.

(10) Patent No.: US 6,250,932 B1
(45) Date of Patent: Jun. 26, 2001

(54) INSULATING DIVIDER AND CONNECTOR FOR HOT PLUG ADAPTER CARD SLOTS

(75) Inventors: Peter Andrew Smith, Ayrshire (GB); Cynthia Michelle Grosser, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/400,420

(22) Filed: Sep. 21, 1999

(51) Int. Cl.[7] .................................................. H01R 12/00
(52) U.S. Cl. .............................................. 439/61; 361/752
(58) Field of Search .............................. 439/61, 637, 326, 439/64, 328; 361/752, 757, 758, 818, 820

(56) References Cited

U.S. PATENT DOCUMENTS

| | | | |
|---|---|---|---|
| 3,506,877 | * 4/1970 | Owen | 361/715 |
| 5,174,778 | * 12/1992 | Lin | 439/326 |
| 5,176,531 | * 1/1993 | Lin | 439/326 |
| 5,192,220 | * 3/1993 | Billman et al. | 439/637 |
| 5,388,030 | * 2/1995 | Gasser et al. | 361/818 |
| 5,481,440 | * 1/1996 | Oldham et al. | 362/32 |
| 5,892,663 | * 4/1999 | Bolinger et al. | 361/799 |
| 5,931,701 | * 8/1999 | Pan et al. | 439/637 |
| 6,036,548 | * 3/2000 | Braithwaite | 439/637 |
| 6,118,667 | * 9/2000 | Grosser et al. | 361/752 |

* cited by examiner

Primary Examiner—Tulsidas Patel
(74) Attorney, Agent, or Firm—Martin J. McKinley

(57) ABSTRACT

A connector for use in a computer is arranged so as to accept an adapter card and a card insulator. The adapter card is inserted into one or more first openings. The card insulator is inserted into one or more second openings. The connector has an insulating molding common to the first and second openings.

7 Claims, 2 Drawing Sheets

INSULATING DIVIDER AND CONNECTOR FOR HOT PLUG ADAPTER CARD SLOTS

RELATED APPLICATIONS

The present invention is related to application Ser. No. 09/176,997, filed Oct. 22, 1998, now U.S. Pat. No. 6,118,667 and entitled "Card Insulator and Guide For A Computer System Having Hot Plugable Adapter Cards".

FIELD OF THE INVENTION

The present invention relates generally to personal and other computers in which adapter cards can be added to and removed from the computer without the necessity for the removal of power from the computer, and more particularly to an improved method of mounting an electrical insulator that reduces the chance of electrical short circuits during the addition or removal of an adapter card.

BACKGROUND OF THE INVENTION

Personal computer systems are well known in the art. Personal computer systems in general, and IBM Personal Computers in particular, have attained widespread use for providing computer power to many segments of today's modern society. These systems are designed primarily to give independent computer power to a single user and are inexpensively priced for purchase by individuals or small businesses. Personal computer can typically be defined as desktop, floor standing, or portable computers that consist of a system unit having a single central processing unit (CPU) and associated volatile and non-volatile memory, including RAM and BIOS ROM.

One of the distinguishing characteristics of these systems is the use of a motherboard to electrically connect these components together and to provide for adapter or expansion cards to be added to the motherboard to perform any of a wide variety of functions. These functions may be options which a user may select at the time of ordering the computer and which are installed prior to the user installing the computer, or they may be chosen by the user to add to his existing computer. Examples of the functions performed by adapter cards include additional video cards to provide enhanced video output to a system monitor, audio cards to provide for recordal, playback and editing of data relating to audio, communication cards such as a modem card or a Local Area Network card to allow communication with other computers over a network, or a fax card to allow fax transmissions to be sent and received. Additionally, such adapter cards may provide for more memory to be added to an existing computer than can be added to the motherboard. A system typically also includes a system monitor, a keyboard, one or more flexible diskette drives, a fixed disk storage drive (also known as a "hard drive"), a so-called "mouse" pointing device, and an optional printer.

Adapter cards consist of a printed circuit board with electronic components mounted on the circuit board, a number of contact strips provided along an edge of the circuit board which are intended to plug into a connector of the corresponding type on the motherboard, and a plate-shaped mounting bracket at one end of the circuit board to provide mechanical fixing of the card to the computer system and also to provide for the positioning of connectors to allow connections to external devices to be made.

In many computers, the insertion or the removal of an adapter card requires that the power to the computer be turned off prior to insertion or removal of an adapter card. In more recent systems, adapter cards can be inserted into and removed from the computer while the system still has power applied. The insertion or removal operation whilst power is still applied is called "hot-plugging".

Since many adapter cards have a plate-shaped mounting bracket at one end of the circuit board and because, in a "hot-plug" computer, the computer still has power applied during insertion or removal of an adapter card, accidental contact between the mounting bracket and components on the motherboard may cause an electrical short circuit. Similarly, accidental contact between the mounting bracket or other conductive parts of the adapter card and adjacent adapter cards may also cause an electrical short circuit.

Existing solutions to this problem include the attachment of rigid dividers to the computer chassis rather than to the card itself. These rigid dividers must be removed before the motherboard itself can be removed. These rigid dividers and their corresponding mountings are also expensive. Another solution is the use of a substantially rectangular card insulator positioned between two adjacent adapter cards. The card insulator is attached to a motherboard insulator, which is a large sheet of semi-rigid or rigid plastic covering the entire motherboard.

So it would be desirable to provide a solution which did not require a large insulator over the entire motherboard and which did not require the use of large rigid insulators associated with each of the adapter cards.

DISCLOSURE OF THE INVENTION

Accordingly, the present invention provides a connector for use in a computer, the connector arranged so as to accept an adapter card and a card insulator, the connector having one or more first openings for insertion of said adapter card and one or more second openings for insertion of said card insulator, the connector having an insulating moulding common to said first and second openings.

By having the card insulator fitting into the same connector assembly as the adapter card itself, but using separate mounting openings, the adapter card may be removed without removal of the card insulator and card insulators may be applied only to those adapter card slots for which they are deemed necessary.

The invention also provides a card insulator for use in a computer, the computer comprising a motherboard having a connector for receiving an adapter card, the card insulator being for insulating said adapter card, the card insulator having tabs for insertion into one or more openings in said connector.

BRIEF DESCRIPTION OF THE DRAWINGS

Embodiments of the invention will now be described, by way of example, with reference to the accompanying drawings, in which.

DETAILED DESCRIPTION OF THE INVENTION

Figure 1:
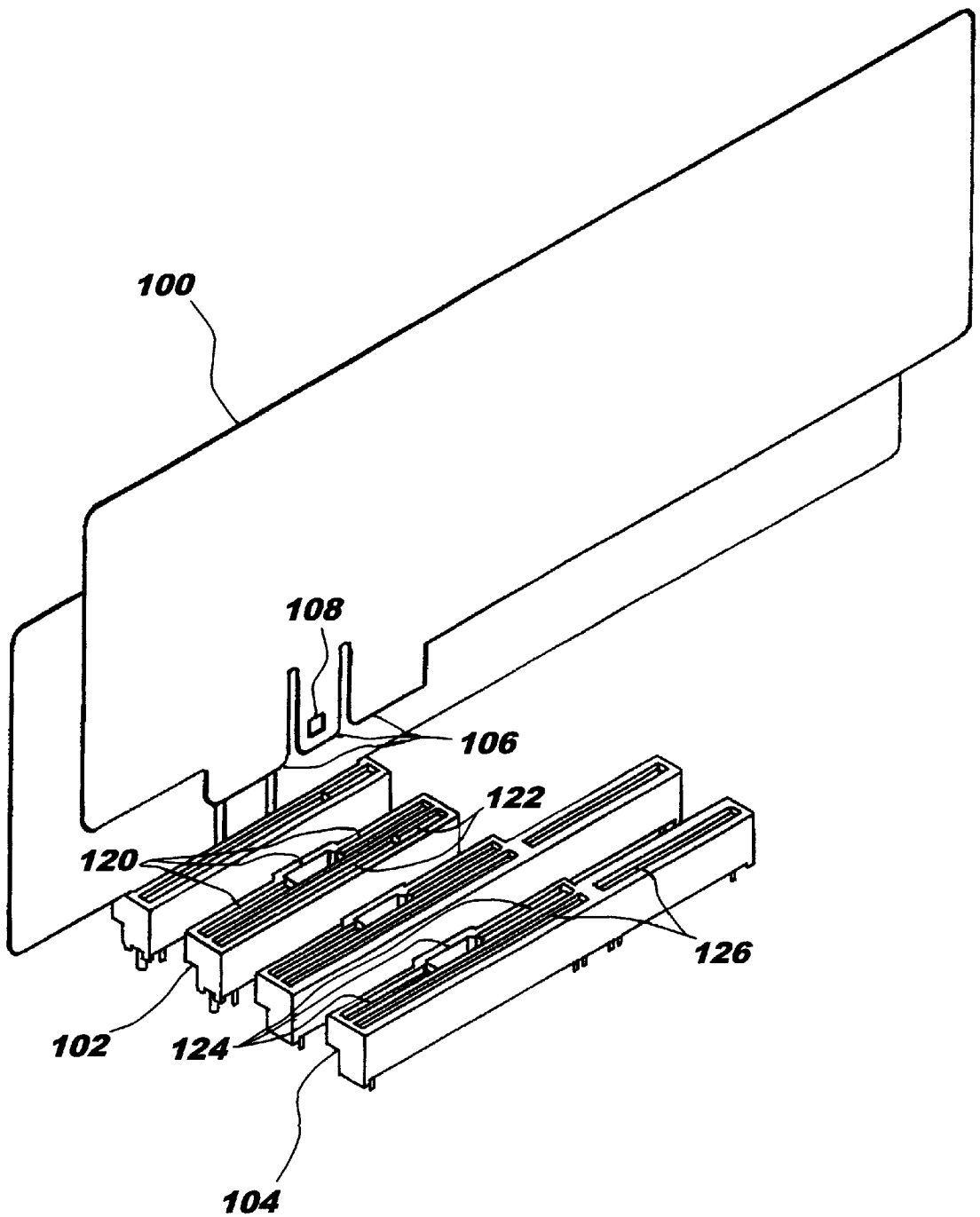
FIG. 1 is an isometric view of a card insulator and connectors according to the present invention.

Referring firstly to FIG. 1, card insulators and connectors according to the present invention are shown. The card insulator 100 includes three tabs 106 for location into the adapter card connector 102. One of the tabs 106 has an aperture 108 which co-operates with a corresponding retaining tab in the connector 102 to hold the card insulator 100 in place. The card insulator 100 is made so that it substantially covers the rear face of the adapter card with which it is associated. In this way, short circuits between connections or components on the rear face of the adapter card with which the card insulator 100 is associated and other conductive items is largely prevented. The adapter card insulator 100 is typically 1 mm in thickness, is made of a material such as polycarbonate or ABS which has a V-0 flammability rating and preferably has a printable surface. The adapter card insulator 100 may be punched from sheet material. The adapter card insulator 100 may optionally include a molded lightpipe for any LEDS that are located on the mother board.

The dimensions of the card insulator 100 are chosen to be appropriate to the dimensions of the adapter card. Although the following dimensions have been given, these dimensions are merely typical dimensions and the invention is not restricted to embodiments which use these typical dimensions or dimensions similar to these typical dimensions. Typically, the two outermost of the three tabs have dimensions of 28 mm to 29 mm in width and 13 mm in depth. The centre one of the three tabs has typical dimensions of 15 mm in width and 28 mm in depth. A taper is preferably applied to the two corners of each tab so as to allow for easier insertion of the tabs in the corresponding openings in the connector 102. The taper is typically a 27 degree taper applied for the first 3.5 mm of the tab. The aperture 108 is 5.5 mm square.

Also shown in FIG. 1 is an adapter card connector 102 according to the present invention. The adapter card connector 102 has openings 122 for the insertion of a conventional adapter card. These openings are conventional openings and conform to the architecture of the card which is to be plugged into the slots, such as, for example, the PCI architecture. In the description of the present invention, the term "slot" is used to refer to a location into which a single adapter card is plugged and the term opening is used to refer to the individual openings present in each of the connectors associated with each of the slots. The number and dimensions of the openings may vary, according to the architecture of the adapter card which is to be inserted into the slots. Additionally, adapter card connector 102 has openings 120 for the insertion of the card insulator 100. In the preferred embodiment, the centre opening includes a retaining tab which is used to hold the card insulator in place within the opening. The adapter card connector is based on existing connectors, with the molding being modified so as to incorporate the additional opening 120. A card insulator 100 may be added to those slots or adapter cards where it is desired to provide such protection against accidental short circuit and may be omitted where such protection is not deemed to be necessary. The molding required on the adapter card connector is an addition to an existing molding and so is cheap to implement.

FIG. 1 further shows an alternative connector 104 having more electrical connections than the connector 102. However, the openings 124 which are added for the installation of a card insulator are the same as openings 120 and a common design of card insulator 100 may be used in both connectors 102 and 104.

Figure 2:
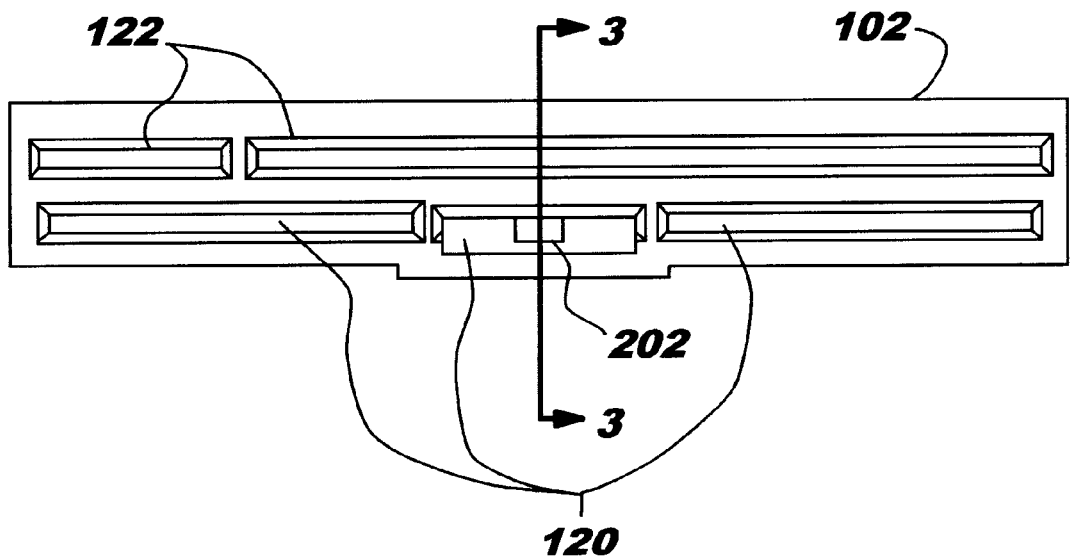
FIG. 2 is a plan view of a connector such as that shown in FIG. 1.

FIG. 2 shows a plan view of a connector 102 such as that shown in FIG. 1. The two openings 122 for insertion of the adapter card can be seen. These openings are dimensioned to suit the architecture of the adapter card. The three additional openings 120 for the insertion of the card insulator 100 can also be seen. These openings are typically 1.1 mm in width, which allows the 1 mm thickness of the card insulator 100 to fit inside the opening. The two outermost of the three openings are typically 29.5 mm in length, which allows the 28 to 29 mm thickness of the card insulator 100 to fit inside the opening. The centre one of the three openings is typically 16 mm in length, thus allowing the 15 mm width of the center tab to fit inside the opening. Retaining tab 202 is located in the centre opening for engaging with the aperture 108 in order to hold the card insulator 100 in place within the connector 102. The number of openings and the dimensions given are typical dimensions and the invention is not restricted to embodiments which use these typical dimensions or dimensions similar to these typical dimensions.

Figure 3:
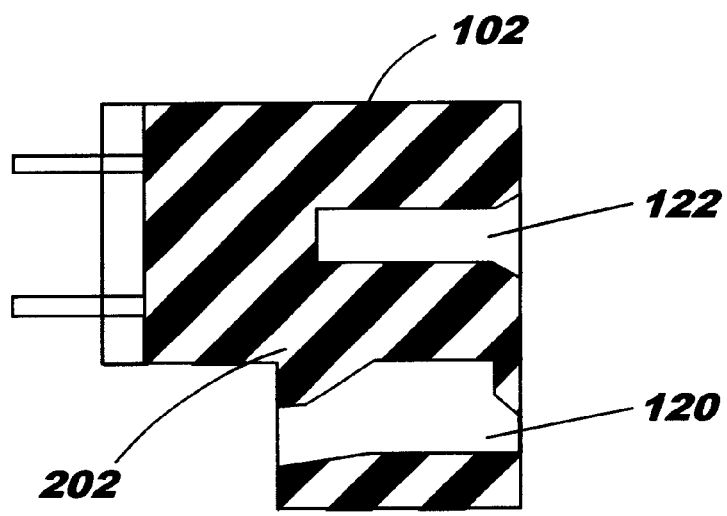
FIG. 3 is a sectional view of the connector of FIG. 2.

FIG. 3 is a cross-sectional view of the connector of FIG. 2. The opening 122 for insertion of the adapter card can be seen as can the opening 120 for the adapter card insulator 120. Retaining tab 202 can also be seen in this cross-section view.

What is claimed is:

1. A computer system, comprising:
a first connector having first and second openings, the first opening for receiving a first adapter card, the second opening for receiving a card insulator, the second opening being different from the first opening such that an adapter card cannot be inserted into the second opening and a card insulator cannot be inserted into the first opening, the first connector having an insulating body common to and surrounding the first and second openings;

a second connector having a third opening for receiving a second adapter card; the third opening being adjacent to and substantially parallel to the second opening of the first connector;

first and second adapter cards, each having an edge connector, the edge connector of the first adapter card being inserted into the first opening of the first connector, and the edge connector of the second adapter card being inserted into the third opening of the second connector; and a card insulator having a connecting edge inserted into the second opening of the first connector;

wherein the card insulator is positioned between the first and second adapter cards such that the card insulator inhibits the electrical shorting of the first adapter card when the first adapter card is inserted into or removed from the first opening of the first connector.

2. The computer system of claim 1, further comprising a retention mechanism for retaining the card insulator within the second opening of the first connector.

3. The computer system of claim 2, wherein the retention mechanism includes:
a first tab located along the connecting edge of the card insulator, the first tab being inserted into the second opening of the first connector, the first tab including an aperture; and a retaining tab located within the second opening of the first connector, the retaining tab being inserted into the aperture of the first tab to retain the card insulator within the second opening.

4. A computer system for use with first and second adapter cards and a card insulator, the computer system comprising:
a first connector having first and second openings, the first opening for receiving a first adapter card, the second opening for receiving a card insulator, the second opening being different from the first opening such that an adapter card cannot be inserted into the second opening and a card insulator cannot be inserted into the first opening, the first connector having an insulating body common to and surrounding the first and second openings;

a second connector having a third opening for receiving a second adapter card; the third opening being adjacent to and substantially parallel to the second opening of the first connector;

wherein, when the first adapter card and the card insulator are installed, respectively, in the first and second openings of the first connector, and when the second adapter card is installed in the third opening of the second connector, the card insulator is positioned between the first and second adapter cards such that the card insulator inhibits the electrical shorting of the first adapter card when the first adapter card is inserted into or removed from the first opening of the first connector.

5. The computer system of claim 4, further comprising a retention mechanism for retaining the card insulator within the second opening of the first connector.

6. The computer system of claim 5, wherein the retention mechanism includes a retaining tab located within the second opening of the first connector, the retaining tab for insertion into an aperture of the card insulator to retain the card insulator within the second opening.

7. A card insulator for use in a computer for insulating one adapter card from another, wherein the computer includes a first connector having first and second openings, the first opening for receiving a first adapter card, the second opening for receiving the card insulator, the second opening being different from the first opening such that an adapter card cannot be inserted into the second opening and the card insulator cannot be inserted into the first opening, the first connector including a retaining tab positioned within the second opening, the computer also having a second connector adjacent to the second opening of the first connector for receiving a second adapter card, wherein the card insulator comprises:

a substantially planar sheet comprised of an insulating material; and a flexible tab extending from one edge of the planar sheet, the flexible tab including an aperture for receiving the retaining tab of the first connector;

wherein, when the first adapter card and the card insulator are installed, respectively, in the first and second openings of the first connector, and when the second adapter card is installed in the second connector, the card insulator is positioned between the first and second adapter cards such that the card insulator inhibits the electrical shorting of the first card when the first adapter card is inserted into or removed from the first opening of the first connector.

* * * * *